United States Patent
Takata et al.

(10) Patent No.: US 6,835,527 B2
(45) Date of Patent: Dec. 28, 2004

(54) CHEMICAL AMPLIFYING TYPE POSITIVE RESIST COMPOSITION

(75) Inventors: Yoshiyuki Takata, Toyonaka (JP); Hiroshi Moriuma, Toyonaka (JP)

(73) Assignee: Sumitomo Chemical Company, Limited, Osaka (JP)

( * ) Notice: Subject to any disclaimer, the term of this patent is extended or adjusted under 35 U.S.C. 154(b) by 199 days.

(21) Appl. No.: 10/105,386

(22) Filed: Mar. 26, 2002

(65) Prior Publication Data

US 2003/0039918 A1 Feb. 27, 2003

(30) Foreign Application Priority Data

Mar. 28, 2001 (JP) ........................................ 2001-092326
Jan. 16, 2002 (JP) ........................................ 2002-007166

(51) Int. Cl.[7] ............................................... G03F 7/004
(52) U.S. Cl. ..................................... 430/270.1; 430/910
(58) Field of Search ............................. 430/270.1, 910, 430/905

(56) References Cited

U.S. PATENT DOCUMENTS

| 6,280,898 B1 | 8/2001 | Hasegawa et al. |
| 2001/0026901 A1 | 10/2001 | Maeda et al. |
| 2001/0044070 A1 | 11/2001 | Uetani et al. |
| 2003/0010748 A1 * | 1/2003 | Kadama et al. ............... 216/41 |

FOREIGN PATENT DOCUMENTS

| EP | 1 127 900 A1 | 8/2001 |
| EP | 1 162 506 A1 | 12/2001 |
| EP | 1 164 434 A2 | 12/2001 |
| EP | 1 179 750 A1 | 2/2002 |
| EP | 1 193 558 A2 | 4/2002 |
| EP | 1 225 480 A2 | 7/2002 |
| JP | 2000-26446 | 1/2000 |
| JP | 2000-159758 | 6/2000 |
| JP | 2001-22070 | 1/2001 |
| JP | 2001-22072 | 1/2001 |

OTHER PUBLICATIONS

Hofer et al., J. photopolymer Sci. and Tech., vol. 9, No. 3 (1996) pp. 387–398.
Wallow et al., SPIE, vol. 2724 (1996) pp. 355–364.

* cited by examiner

*Primary Examiner*—Rosemary Ashton
(74) *Attorney, Agent, or Firm*—Birch, Stewart, Kolasch & Birch, LLP

(57) ABSTRACT

A resist composition excellent in balance of performance of resolution and sensitivity as well as in solubility and, particularly, suitable for use as a positive photo resist which comprises a resin having a alicyclic lactone structure unit that is insoluble in alkali by itself but becomes soluble due to the action of an acid, a solvent containing 2-heptanone and an acid generating agent, wherein a content of 2-heptanone in the solvent is in a weight ratio of from about 5 to about 95% is provided.

8 Claims, No Drawings

CHEMICAL AMPLIFYING TYPE POSITIVE RESIST COMPOSITION

BACKGROUND OF THE INVENTION

The present invention relates to a chemical amplifying type positive resist composition used in the minute processing of a semiconductor.

A lithography process using a resist composition has usually been adopted in the minute processing of a semiconductor. In the lithography, the resolution can be improved with a decrease in wavelength of exposure light in principle as expressed by the equation of Rayleigh's diffraction limit. A g-line with a wavelength of 436 nm, an i-line with a wavelength of 365 nm, and a KrF excimer laser with a wavelength of 248 nm have been adopted as exposure light sources for lithography used in the manufacture of a semiconductor. Thus, the wavelength has become shorter year by year. An ArF excimer laser having a wavelength of 193 nm is considered to be promising as a next-generation exposure light source.

A lens used in an ArF excimer laser exposure machine has a shorter lifetime as compared with lenses for conventional exposure light sources. Accordingly, the shorter time required or exposure to ArF excimer laser light is desirable. For this reason, it is necessary to enhance the sensitivity of a resist. Consequently, there has been used a so-called chemical amplifying type resist, which utilizes the catalytic action of an acid generated by exposure and contains a resin having a group cleavable by the acid.

It is known that, desirably, resins used in a resist for ArF excimer laser exposure have no aromatic ring in order to ensure the transmittance of the resist, but have an alicyclic ring in place of an aromatic ring In order to impart a dry etching resistance thereto. Various kinds of resins such as those described in Journal of Photopolymer Science and Technology, Vol. 9, No. 3, pages 387–398 (1996) by D. C. Hofer, are heretofore known as such resins.

As a resin used in a resist for ArF excimer laser exposure, a mutual copolymer composed of a polymerization unit of alicyclic olefin and a polymerization unit of an unsaturated dicarboxylic acid anhydride (T. I. Wallow et al., Proc. SPIE, vol. 2724, pp. 355–364 (1996)), a polymer having an alicyclic lactone structure unit (JP-A-2000-26446) and the like are known.

Conventionally, glycol ether esters, esters, ketones, cyclic esters and the like have been used as resist solvents. However, there is a problem that the solubility of the resins prepared by using a polymer having an alicyclic lactone structure unit In the conventional solvents is not satisfactory.

One object of the present invention is to provide a chemical amplification type positive resist composition comprising a resin component prepared by using a polymer having an alicyclic lactone structure unit and an acid generating agent which is particularly suitable for lithography using excimer lasers such as ArF and KrF, and has an excellent polymer dissolving capability.

The present inventers have conducted an extensive studies and have found that a solubility of the resin can be improved by using a specific amount of a specific solvent. The present invention has been accomplished based on this finding.

SUMMARY OF THE INVENTION

The present invention provides a resist composition comprising a resin having a alicyclic lactone structure unit that is insoluble in alkali by itself but becomes soluble due to the action of an acid, a solvent containing 2-heptanone and an acid generating agent, wherein a content of 2-heptanone in the solvent is in a weight ratio of from about 5 to about 95%.

DESCRIPTION OF EMBODIMENTS

Generally, a resist solution is prepared by dissolving each of the components consisting of a resin and an acid generating agent in a solvent, and the resist solution is then applied on a substrate such as a silicon wafer by a conventional method such as a spin coating. The solvent is required to dissolve each of the components, to attain a satisfactory drying rate and to supply an even and smooth coating after it is evaporated.

The resist composition of the present invention is characterized in that it contains 2-heptanoen as the specific solvent component, and a content of 2-heptanone in the solvent is in a weight-ratio of from about 5 to about 95%.

Other solvents such as esters, glycol ether esters, cyclic esters, ketones and the like may preferably be used since they will contribute to improve profiles Specific examples of the solvents include:

ethyl cellosolve acetate,
methyl cellosolve acetate,
propylene glycol monomethyl ether acetate,
methyl lactate,
butyl acetate,
amyl acetate,
ethyl pyruvate,
acetone,
methyl isobutyl ketone,
cyclohexanone and
a-butylolactone, As a specific example of a combination and a ratio of the above solvents, a combination of 2-heptanone and propylene glycol monomethyl ether acetate in a ratio of 5–95 wt. %:95–5 wt. % is preferable, since excellent dissolving properties as well as profile are expected by the combination.

It is also preferable to use a combination of 2-heptanone, propylene glycol monomethyl ether acetate and a-butylolactone in a ratio of 10–85 wt. %:85–10 wt. %:1–10 wt. %, more preferably 19–75 wt. %:80–24 wt. %:1–10 wt. %, since excellent dissolving capability is expected.

The resin as a component of the positive resist composition of the present invention has an alicyclic lactone structure unit. The alicyclic lactone structure unit may preferably be selected from the group consisting of polymerization units represented by the following formulas (Ia) and (Ib)

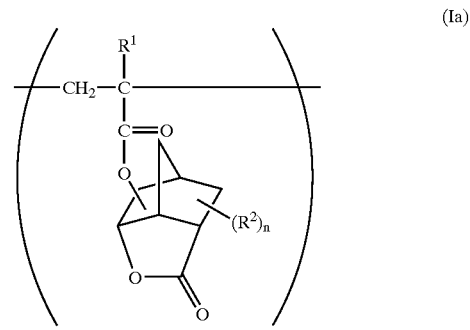

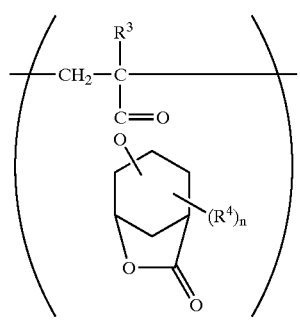

wherein $R^1$, $R^2$, $R^3$ and $R^4$ each independently represent hydrogen or methyl, n represents an integer of 1–3, provided that when $R^2$ or $R^4$ is two or more, each of them may be same as or different from each other.

Specific examples of a monomer from which the polymerization units represented by the formulas (Ia) and (Ib) are derived include (meth)acrylic acid esters of alicyclic lactone having a hydroxyl group shown below and mixtures thereof, such as those shown below.

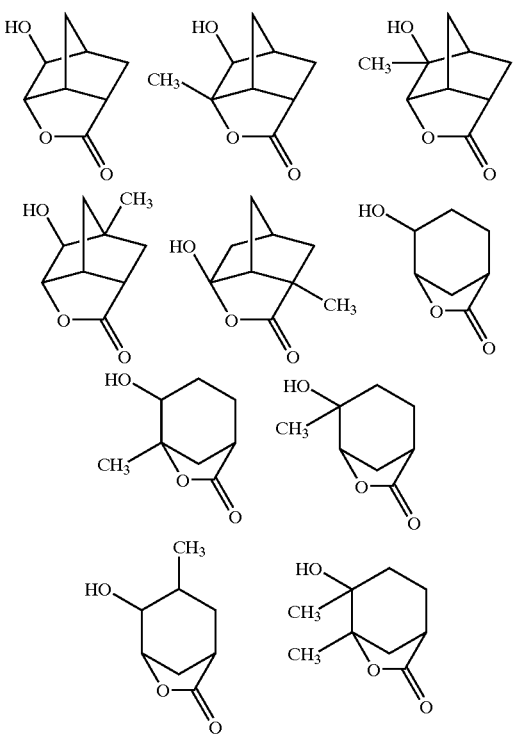

These esters can be prepared, for example by reacting a corresponding cyclic lactone having hydroxyl group with (meth)acrylic acids (e.g. JP2000-26446A).

The resin of the positive resist composition of the present invention is insoluble in alkali by itself but becomes soluble due to the action of an acid. Such a resin preferably contains a polymerization unit having a group de-blocked due to the action of an acid and becomes alkali-soluble due to the de-blockage is exemplified as the resin of the present invention.

Specific examples of the group de-blocked due to the action of an acid include various types of carboxylic acid esters, including: alkyl esters having about 1 to 6 carbons typified by tert-butyl ester: acetal esters such as methoxymethylester, ethoxymethylester, 1-ethoxyethyl ester, 1-isobutoxyethyl ester, 1-isopropoxyethyl ester, 1-ethoxypropyl ester, 1-(2-methoxyethoxy)ethyl ester, 1-(2-acetoxyethoxy)ethyl ester, 1-[2-(1-adamantyloxy)ethoxy]ethyl ester, 1-[2-(1-adamantanecarbonyloxy)ethoxy]ethyl ester, tetrahydro-2-furyl ester and tetrahydro-2-pyranyl ester, and alicyclic esters such as 2-alkyl-2-adamantyl, 1-(1-adamantyl)-1-alkylalkyl and isobornyl ester.

The monomer from which the polymerization unit having a carboxylic acid ester described above is derived may be an acrylic one such as methacrylic acid ester and acrylic acid ester, or an alicyclic monomer with a carboxylic ester group bound thereto, such as norbornene carboxylic acid ester. tricyclodecene carboxylic acid ester and tetracyclodecene carboxylic acid ester. Otherwise, it may be an ester formed by an alicyclic group of an alicyclic carboxylic acid ester and an acrylic acid or a methacrylic acid, as described in Iwasa et al., Journal of Photopolymer Science and Technology, Vol. 9, No. 3, pp. 447–456 (1996).

Among the monomers described above, one having a bulky group containing an alicyclic group such as 2-alkyl-2-adamantyl and 1-(1-adamantyl)-1-alkylalkyl, as the group de-blocked due to the action of an acid, is preferably used because such a monomer exhibits excellent resolution. Examples of the monomer having a bulky group containing an alicyclic group include (meth)acrylic acid 2-alkyl-2-adamantyl, (meth)acrylic acid 1-(1-adamantyl)-1-alkylalkyl, 5-norbornene-2-carboxylic acid 2-alkyl-2-adamantyl and 5-norbornene-2-carboxylic acid 1-(1-adamantyl)-1-alkylalkyl.

Among others, use of (meth)acrylic acid 2-alkyl-2-adamantyl as the monomer is preferred for its excellent resolution. Typical examples of the (meth)acrylic acid 2-alkyl-2-adamantyl include acrylic acid 2-methyl-2-adamantyl, methacrylic acid 2-methyl-2-adamantyl, acrylic acid 2-ethyl-2-adamantyl, methacrylic acid 2-ethyl-2-adamantyl and acrylic acid 2-n butyl-2-adamantyl. Particularly, methacrylic acid 2-ethyl-2-adamantyl are preferred, since it gives good balance between sensitivity and heat resistance.

The resin to be used in the present invention can contain other polymerization unit(s), if required, in addition to the polymerization units represented by the formulas (Ia) and (Ib) and a polymerization unit having a group de-blocked due to the action of an acid.

Examples of the other polymerization units include a polymerization unit represented by the following formula (II), a polymerization unit derived from a polymerization unit represented by the following formula (III) and unsaturated dicarboxylic acid anhydride selected from maleic anhydride and itaconic anhydride, and a polymerization unit represented by the following formula (IV) and a polymerization unit represented by the following formula (V) and the like.

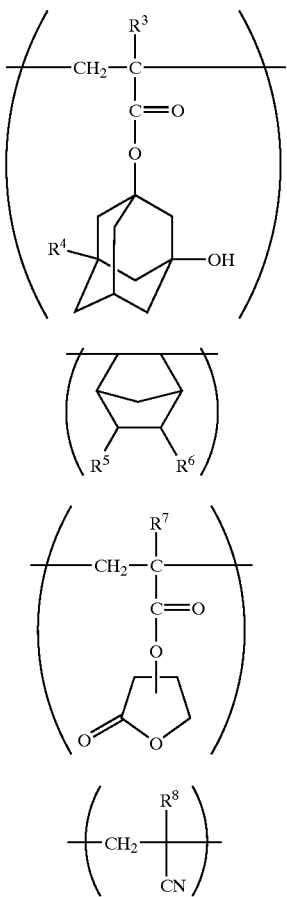

wherein, $R^3$, $R^7$, $R_6$ independently represent hydrogen or methyl, $R^4$ represents hydrogen or a hydroxyl group. $R^5$ and $R^6$ independently represent hydrogen, alkyl group having 1 to 3 carbon atoms, hydroxyalkyyl group having 1 to 3 carbon atoms, carboxyl, cyano or group-$COOR^9$ wherein, $R^9$ is an alcohol residue, or $R^5$ and $R^6$ may be combined to form a carboxylic anhydride residue represented by —C(=O)OC(=O)—.

A monomer from which the polymerization unit represented by the formula (II) having (meth)acrylic acid 1-adamantyl-3-hydroxy is derived can be prepared by reacting a corresponding hydroxyadamantan with (meth)acrylic acids (e.g. JP63-33350A), for example.

Examples thereof Include:

3-hydroxy-1-adamantyl acrylate;
3-hydroxy-1-adamantyl methacrylate;
3,5-dihydroxy-1-adamantyl acrylate; and
3,5-dihydroxy-1-adamantyl methacrylate.

In the formula (III), $R^5$ and $R^6$ independently represent hydrogen, alkyl group having 1 to 3 carbon atoms, hydroxyalkyl group having 1 to 3 carbon atoms, carboxyl, cyano or group-$COOR^9$, wherein $R^9$ is an alcohol residue. $R^5$ and $R^6$ may be combined to form a carboxylic anhydride residue represented by —C(=O)OC(=O)—.

Specific examples of the alkyl group, as $R^5$ or $R^6$, include methyl, ethyl, propyl and the like. Specific examples of the hydroxyalkyl group(s), as $R^5$ or $R^6$, include hydroxymethyl, 2-hydroxyethyl and the like.

The group represented by —$COOR^9$ is a esterified carboxyl. Examples of the alcohol residue as $R^9$ include alkyl group having about 1 to 8 carbon atoms, which may optionally be substituted, 2-oxo-oxolane-3- or -4-yl and the like, wherein examples of the substituent for alkyl may be a hydroxyl group or an alicyclic hydrocarbon residue and the like.

Specific examples of the carboxylic acid ester residue(s) represented by —$COOR^9$ include methoxycarbonyl, ethoxycarbonyl, 2-hydroxyethoxycarbonyl, tert-butoxycarbonyl, 2-oxo-oxolane-3-yloxycarbonyl, 2-oxo-oxolane-4-yloxycarbonyl, 1,1,2-trimethylpropoxycarbonyl. 1-cyclohexyl-1-methylethoxycarbonyl, 1-(4-methylcyclohexyl)-1-methylethoxycarbonyl, 1-(1-adamantyl)-1-methylethoxycarbonyl and the like .

Specific examples of monomers deriving an alicyclic polymerization unit represented by the formula (III) include:

2-norbornen;
2-hydroxy-5-norbornen;
5-norbornen-2-carboxylate;
methyl 5-norbornen-2-carboxylate;
5-norbornen-2-carboxylate-t-butyl
1-cyclohexyl-1-methylethyl 5-norbornen-2-carboxylate;
1-(4-methylcyclohexyl)-1-methylethyl 5-norbornen-2-carboxylate;
1-(4-hydroxycyclohexyl)-1-methylethyl 5-norbornen-2-carboxylate;
1-methyl-1-(4-oxocyclohexyl)ethyl 5-norbornen-2-carboxylate;
1-(1-adamantyl)-1-methylethyl 5-norbornen-2-carboxylate;
1-methylcyclohexyl 5-norbornen-2-carboxylate;
2-methyl-2-adamantyl 5-norbornen-2-carboxylate;
2-ethyl-2-adamantyl 5-norbornen-2-carboxylate;
2-hydroxy-1-ethyl 5-norbornen-2-carboxylate;
5-norbornen-2-methanol;
5-norbornen-2, 3-dicarboxylic acid anhydride;

The polymerization unit derived from the unsaturated dicarboxylic acid anhydride is selected from the group consisting of a polymerization unit derived from maleic anhydride and a polymerization unit derived from itaconic anhydride, which can respectively be represented by the following formulas (VI) and (VII).

Specific examples of a monomer to be used for deriving these polymerization units may be maleic anhydride, itaconic anhydride and the like.

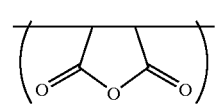 (VI)

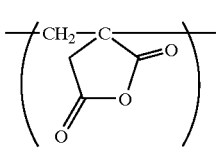 (VII)

Specific examples of a monomer from which the polymerization unit of (meth)acrylic acid (α)β-γ-butylolactone represented by the formula (IV) is derived may be the following compounds that can be prepared by, for example. reacting hydroxy (α) β-γ-butylolactone with (meth) acrylic acids:

acrylic acid α-γ-butylolactone,
methacrylic acid α-γ-butylolactone,
acrylic acid β-γ-butylolactone,
methacrylic acid β-γ-butylolactone and the like.

Specific examples of a monomer from which the polymerization unit of the formula (V) is derived may be the following compounds:

acrylonitrile, and
methacrylonitrile.

Ratios of the polymerization units of the resin to be used in the present invention may be varied depending on a type of radiations for irradiation on patterning exposure, types of arbitrarily selected other optional polymerization units and the like. The ratio of the alicyclic lactone structure unit to the polymerization unit that will become soluble in an alkaline medium due to partial cleavage of the groups by the interaction of acid may preferably be about 90–20 wt. %:10–80 wt. %.

It is preferable to use from about 0.1 to about 50 parts by mol of the other polymerization unit in combination with the above polymerization units with respect to the total amount of the above polymerization units (100 parts by mol).

The copolymerized portion of the alicyclic olefin from which the unit of the formula (III) is derived and the unsaturated dicarboxylic acid anhydride selected from maleic anhydride and itaconic anhydride usually fores an alternating copolymer.

Copolymerization of the resin in the present invention can be conducted in accordance with conventional methods. For example, the copolymer resin of the present invention is obtainable by dissolving predetermined amount of monomers into a necessary amount of organic solvent, and then subjecting the solution to a polymerization reaction in the presence of a polymerization initiator such as azo compound including 2,2'-azobisisobutyronitrile, dimethyl 2,2'-azobis (2-methylpropionate). After the reaction, it is advantageous to purify the resin by way of reprecipitation or the like.

The acid generating agent, another component of the resist composition, is a substance which is decomposed to generate an acid by applying a radiation such as a light, an electron beam or the like on the substance itself or on a resist composition containing the substance. The acid generated from the acid generating agent acts on said resin resulting in cleavage of the group cleavable by the action of an acid existing in the resin.

Such acid generating agents, for example, include other onium salt compounds, organo-halogen compound, sulfone compounds, sulfonate compounds, and the like.

Specific examples thereof include:

diphenyliodonium trifluoromethanesulfonate,
4-methoxyphenylphenyliodonium hexafluoroantimonate,
4-mthoxyphenylphenyliodonium trifluoromethanesulfonate,
bis(4-tert-butylphenyl)iodonium tetrafluoroborate,
bis (4-tert -butylphenyl) iodonium hexafluorophosphate,
bis(4-tert-butylphenyl)iodonium hexafluoroantimonater
bis(4-tert -butylphenyl) iodonium trifluoromethanesulfonate,
triphenylsultfonium hexafluorophosphate,
triphenylsulfonium hexafluoroantimonate,
triphenylsulfonium trifluoromethanesulfonate,
4-methoxyphenyldiphenylsulfonium hexafluoroantimonate,
4-methoxyphenyldiphenylsulfonium trifluoromethanesulfonate,
p-tolyldiphenylsulfonium trifluoromethanesulfonate,
p-tolyldiphenylsulfonium perfluorobutanesulfonate,
p-tolyldiphenylsulfonium perfluorooctanesulfonate,
2,4,6-trimethylphenyldiphenylsulfonium trifluoromethanesulfonate,
4-tert-butylphenyldiphenylsulfonium trifluoromethanesulfonate,
4-phenylthiophenyldiphenylsulfonium hexafluorophosphate
4-phenylthiophenyldiphenylsulfonium hexafluoroantimonate,
1-(2-naphthoylmethyl)thiolanium hexafluoroantimonate,
1-(2-naphthoylmethyl) thiolanium trifluoromethanesulfonate,
4-hydroxy-1-naphthyldimethylsulfonium hexafluoroantimonate,
4-hydroxy-1-naphthyldimethylsulfonium trifluoromethanesulfonate,
oyclohexylmethyl(2-oxocyclohexyl)sulfonium trifluoromethanesulfonate,
cyclohexylmethyl(2-oxocyclohexyl)sulfonium perfluorobutanesulfonate,
cyclohexylmethyl(2-oxocyclohexyl)sulfonium perfluorooctanesulfonate,
2-methyl-4,6-bis(trichloromethyl)-1, 3, 5-triazine,
2,4,6-tris(trichloromethyl)-1,3,5-triazine,
2-phenyl-4,6bis(trichloromethyl)-1,3,5-triazine,
2-(4-chlorophenyl)-4,6-bis(trichloromethyl)-1,3,5-triazine
2-(4-methoxyphenyl)-4,6-bis(trichloromethyl)-1,3,5-triazine,
2-(4-methoxy-1-naphthyl)-4,6-bis(trichloromethyl)-1,3,5-triazine,
2-(benzo[d][1,3]dioxolane-5-yl)-4,6-bis(trichloromethyl)-1,3,5-triazine,
2-(4-methoxystyryl)-4,6-bis(trichloromethyl)-1,3,5-triazine,
2-(3,4,5-trimethoxystyryl)-4,6-bis(trichloromethyl)-1,3,5-triazine,
2-(3,4-dimethoxystyryl)-4,6-bis(trichloromethyl)-1,3,5-triazine,
2-(2,4-dimethoxystyryl)-4,6-bis(trichloromethyl)-1,3,5-triazine,
2-(2-methoxystyryl)-4,6-bis(trichloromethyl)-1,3,5-triazine,
2-(4-butoxystyryl)-4,6-bis(trichloromethyl)-1,3,5-triazine,
2-(4-pentyloxystyryl)-4,6-bis(trichloromethyl)-1,3,5-triazine,
diphenyl disulfone,
di-p-tolyl disulfone,
bis(phenylsulfonyl)diazomethane,
bis(4-chlorophenylsulfonyl)diazomethane,
bis(p-tolylsulfonyl)diazomethane,
bis(4-tert-butylphenylsulfonyl)diazomethane,
bis(2,4-xylylsulfonyl)diazomethane,
bis (cyclohexylsulfonyl)diazomethane, (benzoyl) (phenylsulfonyl)diazomethane,
1-benzoyl-1-phenylmethyl p-toluenesulfonate (so-called benzointosylate),
2-benzoyl-2-hydroxy-2-phenylethyl p-toluenesulfonate (so-called α-methylolbenzointosylate),
1,2,3-benzenetriyl trimethanesulfonate,
2,6-dinitrobenzyl p-toluenesulfonate,
2-nitrobenzyl p-toluenesulfonate,
4-nitrobenzyl p-toluenesulfonate,
N-(phenylsulfonyloxy)succinimide,
N-(trifluoromethylsulfonyloxy)succinimide,
N-(trifluoromethylsulfonyloxy)phthalimide,
N-(trifluoromethylsulfonyloxy)-5-norbornene-2,3-dicarboxyimide,
N-(trifluoromethylsulfonyloxy)naphthalimide,
N-(10-camphorsulfonyloxy)naphthalimide, and the like.

It is also known that, generally in a chemical amplifying type positive resist composition, performance deterioration due to the deactivation of an acid associated with leaving after exposure can be reduced by adding basic compounds, especially basic nitrogen-containing organic compounds such as amines as quenchers. It is also preferable in the present invention that such basic compounds are added. Concrete examples of the basic compounds to be used as quenchors include the ones represented by the following formulae:

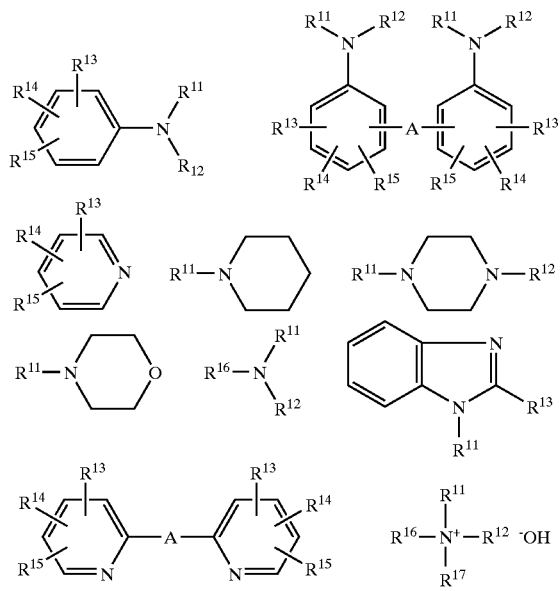

wherein $R^{11}$, $R^{12}$ and $R^{17}$ represent, independently each other, hydrogen, cycloalkyl, aryl or alkyl which may be optionally substituted with a hydroxyl, amino which may be optionally substitiuted with alkyl having 1 to 6 carbon atoms, or alkoxy having 1 to 6 carbon atoms; $R^{13}$, $R^{14}$ and $R^{15}$, which are same or different from each other, represent hydrogen, cycloalkyl, aryl, alkoxy or alkyl which may be optionally substituted with a hydroxyl, amino which may be optionally substituted with alkyl having 1 to 6 carbon atoms, or alkoxy having 1 to 6 carbon atoms; $R^{16}$ represents cycloalkyl or alkyl which may be optionally substituted with a hydroxyl, amino which may be optionally substitiuted with alkyl having 1 to 6 carbon atoms, or alkoxy having 1 to 6 carbon atoms; A represents alkylene, carbonyl, imino, sulfide or disulfide. The alkyl represented by $R^{11}$ to $R^{17}$ and alkoxy represented by $R^{13}$ to $R^{15}$ may have about 1 to 6 carbon atoms. The cycloalkyl represented by $R^{11}$ to $R^{17}$ may have about 5 to 10 carbon atoms and the aryl represented by $R^{11}$ to $R^{15}$ and $R^{17}$ may have about 6 to 10 carbon atoms. The alkylene represented by A may have about 2 to 6 carbon atoms and may be straight-chained or branched. The group represented by $R^{11}$ to $R^{17}$ may be straight chain or branched, The resist composition of the present invention preferably contains the resin in an amount of 80 to 99.9% by weight, and the acid generating agent in an amount of 0.1 to 20% by weight based on the total weight of the resin and the acid generating agent. When a basic compound is used as a quencher, it is preferably contained in an amount in the range of 0.001 to 1 part by weight, more preferably 0.01 to 0.3 part by weight per 100 parts by weight of the resin. The composition may also contain, if required, a small amount of various additives such as sensitizers, dissolution inhibitors, resins other than the above resin, surfactants, stabilizers, and dyes so far as the objects of the present invention is not harmed.

The resist composition of the present invention generally becomes a resist solution in the state in which the above-described components are dissolved in a solvent to be applied on a substrate such as a silicon wafer.

The resist film applied on a substrate, and dried is subjected to an exposure treatment for patterning Then, after a heat-treatment for promoting a protecting deblocking reaction, development by an alkali developer is conducted. The alkali developer herein used can be various kinds of alkaline aqueous solutions used in this field. In general, an aqueous solution of tetramethylammoniumhydroxide or (2-hydroxyethyl)trimethylammoniumhydroxide (so-called colline) is often used.

The present invention will be described in more detail by way of examples, which should not be construed as limiting the scope of the present invention. All parts in examples are by weight unless otherwise stated. The weight-average molecular weight is a value determined from gel permeation chromatography using polystyrene as a reference standard.

In this specification, the monomers respectively having the following structures will be referred to, in the order from left to right of the structures, as "5-methacryloyloxy-2,6-norbornancarbolactone", and "5-acryloyloxy-2,6-norbornancarbolactone".

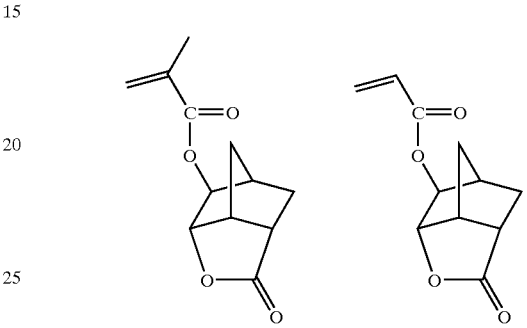

RESIN SYNTHESIS EXAMPLE 1 (SYNTHESIS OF RESIN A1)

2-ethyl-2-adamantyl-methacrylate, 5-methacryloyloxy-2,6-norbornancarbolactone and α-methacryloyloxy-y-butyrolactone were mixed at a ratio of 2:1:1 (11.1 g:5.0 g:3.8 g), and 50 g of 1,4-dioxane was added thereto so as to obtain a solution. Furthermore, 0.30 g of azo-bisisobutyronitrile was added thereto as an initiator Thereafter, it was heated to 85° C., and was stirred for 5 hours. After the reaction mass was cooled, an operation of precipitation by adding the reaction mass to a massive amount of n-heptane was carried out three times for purification, and a copolymer having a weight average molecular weight of approximately 9100 and molecular weight dispersion of 1.72 was obtained. This copolymer is hereinafter referred to as resin A1.

RESIN SYNTHESIS EXAMPLE 2 (SYNTHESIS OF RESIN A2)

2-ethyl-2-adamantyl-methacrylate, 3-hydroxy-1-adamantyl-methacrylate and 5-methacryloyloxy-2,6-norbornancarbolactone were mixed at a ratio of 2:1:1 (11.2 g:5.3 g:5.0 g), and 50 g of 1, 4-dioxane was added thereto so as to obtain a solution. Furthermore, azo-bisisobutyronitrile, equivalent to 2 mol % of all the monomers, was added thereto as an initiator. Thereafter, it was heated to 85° C., and was stirred for 5 hours. After the reaction mass was cooled, an operation of precipitation by adding the reaction mass to a massive amount of n-heptane was carried out three times for purification, and 6.3 g of a copolymer having a weight average molecular weight of approximately 9100 was obtained. (yield; 29%) This copolymer is hereinafter referred to as resin A2.

RESIN SYNTHESIS EXAMPLE 3 (SYNTHESIS OF RESIN A3)

2-ethyl-2-adamantyl-methacrylate, 3-hydroxy-1-adamantyl-acrylate and 5-methacryloyloxy-2,6-norbornancarbolactone were mixed at a ratio of 2:1:1 (37.3 g:16.7 g:16.7 g) and 71 g of methyl-isobutyl ketone was added thereto so as to obtain a solution. Furthermore, azo-bisisobutyronitrile, equivalent to 3 mol % of all the monomers, was added thereto as an initiator. Thereafter, it was heated to 85° C., and was stirred for 7 hours. After the reaction mass was cooled, an operation of precipitation by adding the reaction mass to a massive amount of n-heptane was carried out three times for purification, and 49.8 g of a copolymer having a weight average molecular weight of approximately 12272 was obtained. (yield: 70.61%) This copolymer is hereinafter referred to as resin A3.

RESIN SYNTHESIS EXAMPLE 4 (SYNTHESIS OF RESIN A4)

20.00 g of 2-ethyl-2-adamantyl-methacrylate, 9.52 g of 3-hydroxy-1-adamantyl-methacrylate and 6.85 g of α-methacryloyloxy-y-butyrolactone were mixed, and 90.93 g of methyl-isobutyl ketone was added thereto so as to obtain a solution. After the inner temperature raised up to 85° C., 0.53 g azo-bisisobutyronitrile was added thereto as an initiator, Thereafter, the inner temperature was kept at 85° C. for 5 hours, then the reaction mass was cooled. An operation of precipitation, by adding the reaction mass to a massive amount of n-heptane, was carried out three times for purification, and a copolymer having a weight average molecular weight of approximately 10000, and molecular weight dispersion of 1.45 was obtained. This copolymer is hereinafter referred to as resin A4.

Next, resist compositions were prepared using acid generating agents, quenchers and solvents shown below in addition to the respective resins obtained in the foregoing resin synthesis examples. The results of evaluation of the same are shown below.

EXAMPLE AND COMPARATIVE EXAMPLE

The following components were mixed and dissolved, and filtered through a fluorine resin filter having a pore diameter of 0.2 μm to prepare a resist solution.

| | |
|---|---|
| Resin (as to type, see Table 1) | 10 parts |
| Acid generating agent: p-tolyldiphenyl sulfonium perfluorooctane sulfonate | 0.2 parts |
| Quencher: 2,6-diisopropile aniline | 0.0075 parts |

Solvent (as to weight parts, see Table 1):
  Propylene glycol monomethyl ether acetate: P
  2-heptanon: H
  γ-butyrolactone: G An organic anti-reflective coating composition, ARC-25–8, manufactured by Brewer was coated on a silicon wafer and was baked at 215° C. for 60 seconds, so that a 780 Å-thick organic anti-reflective coating was formed. The resist solution prepared as described above was applied thereon by spin coating so as to have a thickness after drying of 0.39 μm. After the application of the resist, it was pre-baked at a temperature in column "PB" in Table 1 for 60 seconds on a direct hot plate. The wafer on which a resist film was thus provide was exposed to radiation using an ArF eximer stepper ("NSR ArF" manufactured by NICON, NA=0.55, σ=0.6), so that a line-and-space pattern was formed by varying an exposure amount stepwise.

After the exposure, it was subjected to post-exposure baking on a hot plate at a temperature in column "PER" in Table 1 for 60 seconds, and further, subjected to paddle development for 60 seconds by using 2.38 wt. % aqueous solution of tetramethylammonium hydroxide.

A blight field pattern on an organic anti-reflection film substrate after development is observed using a scanning electron microscope, and an effective sensitivity and resolution thereof were examined by the following method. Results of the observation are shown in Table 2.

The blight field pattern is obtainable by an exposure and development by way of a reticule having an outer frame of a chrome layer (beam shielding layer) and linear chrome layers on a base of a glass face (translucent portion) that is provided inside the outer frame. Consequently, the blight field pattern is a pattern wherein a resist layer around a line and space pattern is removed while a resist layer outside the line and space pattern corresponding to the outer frame that remains after the exposure and development.

Effective sensitivity: expressed by exposure amount causing line-and-space pattern of 0.18 μm to be 1:1

Resolution: expressed by a minimum size of a line-and-space pattern resolved with the light exposure of the effective sensitivity.

Used as an Index for M/B: Profile is a ratio of a width of an intermediate portion (M) between an upper portion and a bottom portion to a width of the bottom portion (B) of 0.18 μm line and space pattern in the effective sensitivity that were read from a cross sectional picture Accordingly, it is considered that the profile is improved as the M/B ratio approximates to 1.

Solubility: After storing blight field patterns for a day at a temperature of −15° C., the one on which the resin has not precipitated is marked as ○, and the one on which resin had precipitated is marked as X.

TABLE 1

| No. | Resin | Acid generating agent (parts) | quencher (parts) | Solvent (P/H/G) |
|---|---|---|---|---|
| Example | | | | |
| 1 | A1 | 0.2 | 0.0075 | 15/80/5 |
| 2 | A1 | 0.2 | 0.0075 | 71.25/23.75/5 |
| 3 | A2 | 0.2 | 0.0075 | 15/80/5 |
| 4 | A2 | 0.2 | 0.0075 | 71.25/23.75/5 |
| 5 | A3 | 0.2 | 0.0075 | 15/80/5 |
| 6 | A3 | 0.2 | 0.0075 | 71.25/23.75/5 |
| 7 | A2 | 0.2 | 0.0075 | 0/95/5 |
| 8 | A2 | 0.2 | 0.0075 | 5/95/0 |
| 9 | A2 | 0.2 | 0.0075 | 10/80/10 |
| 10 | A2 | 0.2 | 0.0075 | 80/10/10 |
| 11 | A2 | 0.2 | 0.0075 | 15/84/1 |
| Comparative example | | | | |
| 1 | A1 | 0.2 | 0.0075 | 95/0/5 |
| 2 | A2 | 0.2 | 0.0075 | 95/0/5 |
| 3 | A3 | 0.2 | 0.0075 | 95/0/5 |
| 4 | A4 | 0.2 | 0.0075 | 47.5/47.5/5 |

TABLE 2

| No. | PB (° C.) | PEB (° C.) | Effective sensitivity (mJ/cm²) | Resolution (μm) | M/B | Solubility |
|---|---|---|---|---|---|---|
| Example | | | | | | |
| 1 | 130 | 130 | 17 | 0.16 | 0.79 | ○ |
| 2 | 130 | 130 | 17 | 0.16 | 0.85 | ○ |
| 3 | 130 | 130 | 20 | 0.15 | 0.77 | ○ |
| 4 | 130 | 130 | 20 | 0.15 | 0.83 | ○ |
| 5 | 110 | 110 | 50 | 0.15 | 0.74 | ○ |
| 6 | 110 | 110 | 50 | 0.15 | 0.84 | ○ |
| 7 | 130 | 130 | 29 | 0.15 | 0.75 | ○ |
| 8 | 130 | 130 | 25 | 0.15 | 0.76 | ○ |
| 9 | 130 | 130 | 33 | 0.15 | 0.78 | ○ |
| 10 | 130 | 130 | 35 | 0.15 | 0.84 | ○ |
| 11 | 130 | 130 | 27 | 0.15 | 0.78 | ○ |

TABLE 2-continued

| No. | PB (° C.) | PEB (° C.) | Effective sensitivity (mJ/cm$^2$) | Resolution ($\mu$m) | M/B | Solubility |
|---|---|---|---|---|---|---|
| Comparative example | | | | | | |
| 1 | 130 | 130 | 17 | 0.16 | 0.92 | × |
| 2 | 130 | 130 | 20 | 0.15 | 0.92 | × |
| 3 | 110 | 110 | 50 | 0.15 | 0.90 | × |
| 5 | 130 | 130 | 50 | 0.15 | 0.86 | × |

As is apparent from the Table, the resin compositions of the examples are excellent in solubility as compared to Comparative Examples. Further, the profile is improved as a content of propylene glycol monomethyl ether acetate is increased.

The resist composition of the present invention is excellent in balance of performance of resolution and sensitivity as well as in solubility and, particularly, suitable for use as a positive photo resist. Accordingly, the composition is suitable for exposure using KrF excimer laser or the ArF excimer laser, thereby realizing a resist pattern of high performance, especially a positive resist pattern.

What is claimed is:

1. A resist composition comprising a resin having a alicyclic lactone structure unit that is insoluble in alkali by itself but becomes soluble due to the action of an acid, a solvent containing 2-heptanone and an acid generating agent, wherein a content of 2-heptanone in the solvent is in a weight ratio of from about 5 to about 95%.

2. The resist composition according to claim 1, wherein the alicyclic lactone structure unit is selected from the group consisting of polymerization units represented by the following formulas (Ia) and (Ib):

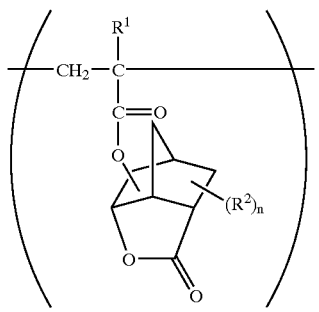
(Ia)

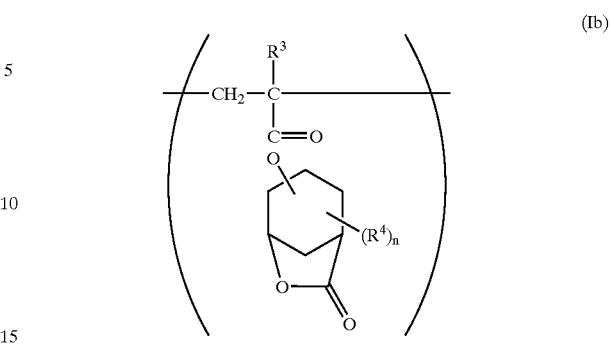
(Ib)

wherein R$^1$, R$^2$, R$^3$ and R$^4$ each independently represent hydrogen or methyl, n represents an integer of 1–3, provided that when R$^2$ or R$^4$ is two or more, each of them may be same as or different from each other.

3. The resist composition according to claim 1, wherein the resin further has polymerization unit that will become soluble in an alkaline medium due to partial cleavage of the groups by the interaction of acid.

4. The resist composition according to claim 3, wherein the ratio of the alicyclic lactone structure unit to the polymerization unit that will become soluble in an alkaline medium due to partial cleavage of the groups by the interaction of is about 90–20 wt. %:10–80 wt. %.

5. The resist composition according to claim 3, wherein the polymerization unit that will become soluble in an alkaline medium due to partial cleavage of the groups by the interaction of acid is a polymerization unit derived from (meth)acrylic acid 2-alkyl-2-adamantyl ester.

6. The resist composition according to claim 5, wherein the alkyl in (meth)acrylic acid 2-alkyl-2-adamantyl ester has 1 to 4 carbon atoms.

7. The resist composition according to claim 1, wherein the acid generating agent is a substance which is decomposed to generate an acid by applying a radiation.

8. The resist composition according to claim 1, which further comprises an amine.

* * * * *

UNITED STATES PATENT AND TRADEMARK OFFICE
CERTIFICATE OF CORRECTION

PATENT NO. : 6,835,527 B2
DATED : December 28, 2004
INVENTOR(S) : Yoshiyuki Takata et al.

It is certified that error appears in the above-identified patent and that said Letters Patent is hereby corrected as shown below:

This certificate supersedes Certificate of Correction issued May 24, 2005, the number was erroneously mentioned and should be vacated since no certificate of correction was granted.

Signed and Sealed this

Twenty-third Day of August, 2005

JON W. DUDAS
*Director of the United States Patent and Trademark Office*